United States Patent [19]

Brust

[11] Patent Number: 4,902,963

[45] Date of Patent: Feb. 20, 1990

[54] METHOD AND ARRANGEMENT FOR RECORDING PERIODIC SIGNALS WITH A LASER PROBE

[76] Inventor: Hans D. Brust, Martin Luther Str. 2, 6602 Dudweiler, Fed. Rep. of Germany

[21] Appl. No.: 295,500

[22] Filed: Jan. 11, 1989

[30] Foreign Application Priority Data

Jan. 28, 1988 [DE] Fed. Rep. of Germany ....... 3802566

[51] Int. Cl.$^4$ .......................................... G01R 31/28
[52] U.S. Cl. .................... 324/158 R; 324/96
[58] Field of Search ................ 324/158 R, 158 D, 96, 324/73 R, 73 PC; 250/492.2, 356, 374, 376

[56] References Cited

U.S. PATENT DOCUMENTS 4,471,302 9/1984 Fazekas et al. ................ 324/158 R
4,706,018 11/1987 Beha et al. ...................... 324/158 R

FOREIGN PATENT DOCUMENTS

0107040A1 5/1984 European Pat. Off. .
0180780 5/1986 European Pat. Off. .
WO87/07028 11/1987 PCT Int'l Appl. .

OTHER PUBLICATIONS

"Subpicosecond Electrooptic Sampling: Principles & Applications"-by Janis A. Valdmanis et al, in IEEE Journal of Quantum Electronics, vol. QE-22, No. 1, Jan. 1986, pp. 69-78.
"Energy & Time Resolved Photoemission in a Promising New Approach for Contactless Integrated-Circuit Testing" by H. K. Seitz et al, Microelectronic Engineering, vol. 5 (1986), pp. 547-553.
"Electron Beam Testing" by E. Wolfgang, Microelectronic Engineering, vol. 4, No. 2 (1986), pp. 77-106.
"High-Speed Electrical Sampling by fs Photoemission" by R. B. Marcus et al, Appl. Phys. Lett. 49(6), Aug. 11, 1986, pp. 357-359.

Primary Examiner—Ernest F. Karlsen
Attorney, Agent, or Firm—Hill, Van Santen, Steadman & Simpson

[57] ABSTRACT

Method and arrangement for recording periodic signals with a laser probe. The application of stroboscopic methods in laser metrology requires the synchronization of the measuring arrangement (scanning laser microscope) with the periodic signal excited in the electronic component to be investigated. Since short laser pulses are very difficult to generate in response to a trigger signal, an attempt is made to derive the module clock from the pulse repetition rate of the laser. This type of synchronization requires complex apparatus particularly when the required clock frequency lies above the pulse repetition rate of the laser. In accordance with the present invention, therefore, a synchronization of the measuring arrangement and of the component is eliminated. In order to assign the proper point in time within the period of the signal to the measured values, the chronological spacing of the laser pulses allocated to the measured values are identified relative to a trigger signal that is synchronous with the signal to be recorded.

11 Claims, 2 Drawing Sheets

METHOD AND ARRANGEMENT FOR RECORDING PERIODIC SIGNALS WITH A LASER PROBE

BACKGROUND OF THE INVENTION

The present invention is directed to a method for recording periodic signals with a laser probe. In the method the laser probe is pulsed and is directed onto at least one point of a specimen carrying a first signal. A secondary signal triggered in or at the specimen by the laser probe is registered and is converted into a measured signal (g(t)). The present invention is also directed to an arrangement for the implementation of the method.

A prior art method is known, for example, from Microelectronic Engineering Vol 5 (1986), pages 547–553 and from the published European application No. 0 180 780 A1.

In electron beam testing, stroboscopic methods are used for recording and/or imaging fast periodic events in component parts of microelectronics (see, for example, Microelectronic Engineering, Vol. 4, No. 2, pages 77–106). As in all methods that utilize the stroboscopic effect, the measuring arrangement composed of a modified scanning electron microscope and of extensive electronics must also be synchronized with the event excited in the component part under investigation. A trigger signal that controls the cut-in time of the electron beam and is synchronous with the event to be recorded is therefore derived from the circuit or from the drive thereof. The transfer of the methods and procedures known from electron beam testing into laser testing (see, for example, IEEE Journal of Quantum Electronics, Vol. 22, No. 1, pages 69–78) with which a higher chronological resolution could be achieved encounters considerable difficulties independently of the utilized interactions and effects (generation of photoelectrons, rotation of the polarization plane in electro-optical crystals, etc.), since short laser pulses are difficult to generate in response to a trigger signal. Attempts have therefore been made to synchronize the component part with the measuring arrangement, for example, the module clock being derived from the pulse repetition rate of the laser. This type of synchronization requires complex apparatus particularly when the clock frequency lies above the pulse repetition rate of the laser.

SUMMARY OF THE INVENTION

An object of the present invention is to provide a method of the type initially cited that does not require any synchronization of the measuring arrangement and of the specimen under examination. This object is inventively achieved by a method wherein the laser probe is asynchronously gated; chronological spacing ($\Delta t$) of the pulses of the laser probe relative to a second signal (CLK) synchronous with said first signal is identified; and the value of the measured signal (g(t)) allocated to the respective pulse of the laser probe and the measured chronological spacing ($\Delta t$) of the pulse relative to the second signal (CLK) are recorded.

For implementing the method an arrangement for recording periodic signals with a laser probe has, a means for generating a pulsed laser probe, a lens system for focusing the laser probe onto a specimen, a means for positioning the laser probe to at least one point of the specimen that carries a first signal, a means for detecting a secondary signal (PE) generated at or in the specimen by the laser probe, an evaluation electronics connected to the means for generating a measured signal (g(t)), said means for generating having an input connected to an output of said means for detecting, and a recording unit having at least a first input connected to an output of said means for generating. The arrangement also has a means for measuring a time difference ($\Delta t$) that has an output connected to a second input of the recording unit, a first input of said means for measuring receiving a second signal (CLK) synchronous with said first signal and a radiation detector whose output signal (SDA) is received by a second input of the means for measuring the time difference ($\Delta t$); the radiation detector receiving on an input thereof the pulsed laser probe.

An advantage of the present invention is that signals in component parts that have asynchronously functioning circuit parts can also be recorded.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
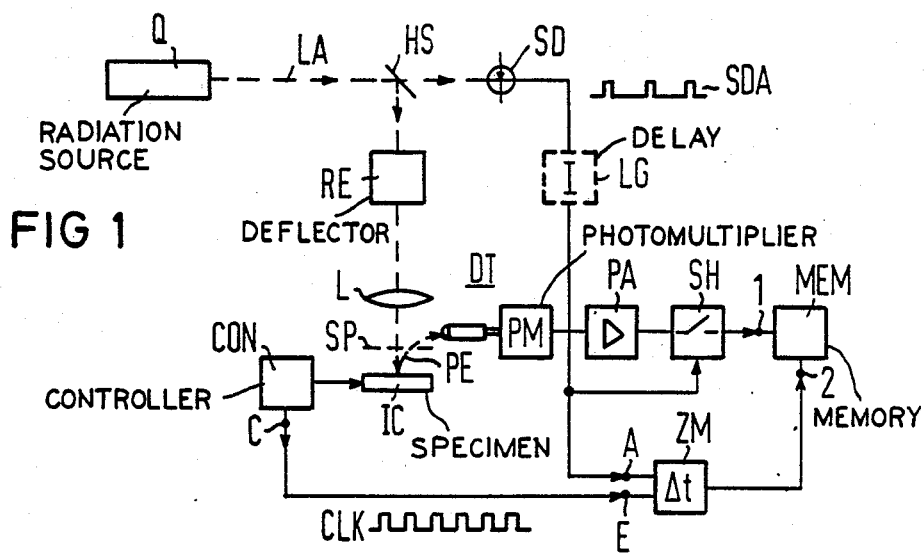
FIG. 1 is a block diagram of an arrangement for implementing the method of the present invention.

The arrangement schematically shown in FIG. 1 for recording a periodic signal in a specimen IC includes a scanning laser microscope, a detector DT for recording the photo-electrons PE triggered on the specimen IC and measuring electronics that is followed by a memory unit MEM. The laser system disclosed by published European application No. 0 180 780 can be utilized as radiation source Q, a pulsed beam LA thereof (pulse repetition rate 5 through 10 MHz, pulse width 1 through 2 ps, photon energy $\gtrsim 5$ eV) being deflected at a semi-transmitting mirror HS and being focused onto the specimen IC by optics L. For positioning the laser beam LA to an arbitrary point on the specimen surface, a deflector unit RE composed, for example, of two galvanometer mirrors rotatable around orthogonal axes, is provided, this being preferably driven with a digital scan generator (not shown in FIG. 1). The detector DT laterally located above the specimen IC that can also be preceded by a spectrometer SP, preferably by a retarding field spectrometer, for quantitative measurement of voltage, is essentially composed of an extraction electrode, of a scintillator, of a light conductor and of a photomultiplier PM that converts the radiant intensity generated in the scintillator into an electrical signal. This signal is amplified in a sensitive pre-amplifier PA and is supplied to the input of a gate circuit SH, particularly a sample and hold circuit, whose output is connected to a data input 1 of a memory unit MEM. Specimen IC can be an integrated digital circuit into which test programs in the form of bit patterns are supplied via a controller CON.

Corresponding to the circuit structure, characteristic signals defining the respective operating condition then appear during the test cycle at nodes and interconnects, the time-dependency of these signals being capable of being identified with the laser beam LA by detecting the photo-electrons PE triggered on the circuit IC and being capable of being compared to the signals acquired from simulation calculations. By analogy to electron beam testing, the dependency of the photoelectron current registered in the detector DT on the voltage of the measuring point is used to sample the amplitude of the signal at the times defined by the laser pulses. Since no synchronization of the measuring arrangement and of the specimen IC is present (pulse repetition rate of the laser being unequal to the frequency of the circuit clock or unequal to a fraction or multiple of the frequency), successive laser pulses sample the signal at different phase points within the period.

Synchronous with the sampling of the signal, the corresponding value of the photo-electron current is also sampled with the gate circuit SH. In order to allocate the correct point in time within the period of the signal to the output signal g(t) of the gate circuit SH, the chronological spacing $\Delta t$ of the laser pulse associated with the respective value of the output signal g(t) relative to a trigger signal CLK synchronous with the signal adjacent at the appertaining measuring point is identified. The trigger signal CLK is the circuit clock that is taken at the output C of the controller CON and is supplied to the stop input E of a chronometer ZM (such as a Tektronix DC 505 A Universal Counter/timer). The laser pulse sampling the specimen IC is thereby registered by a radiation detector SD, for example a photodiode, located immediately following the semi-transmitting mirror HS, the pulse-shaped output signal SDA of this radiation detector SD being potentially delayed by the flight time of the photo-electrons PE to the detector DT and simultaneously appearing at the start input A of the chronometer ZM and at the control input of the gate circuit as well. The delay element required for the compensation of the transit time effects is referenced LG in FIGS. 1 and 4.

After the triggering of the stop signal, the output signal of the chronometer ZM corresponding to the measured time difference $\Delta t$ is simultaneously read into the memory unit MEM via the data input 2 together with the signal value g(t) on the data input 1. The value pairs (g(t), $\Delta t$) stored in the memory MEM can be placed in chronological order after the end of the measurement on the basis of the measured values $\Delta t$ and can be displayed on a recording unit, for example on a monitor. In order to improve the signal-to-noise ratio, the measured values g(t) can also be averaged before being displayed.

Figure 2:
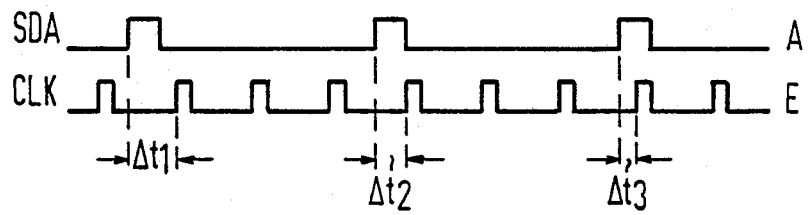
FIGS. 2 and 3 depict signals in the FIG. 1 arrangement for time measurement.
Figure 3:
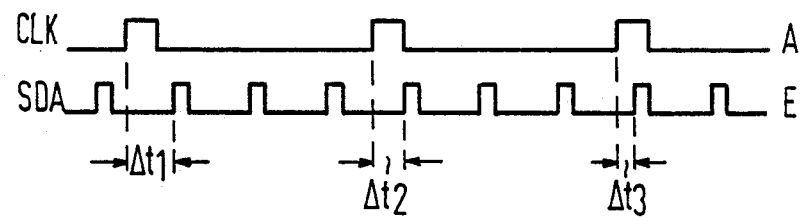

It has hitherto been assumed that the frequency of the module CLK is higher than the pulse repetition rate of the laser (see FIG. 2). If this is not the case, i.e. when the pulse repetition rate of the laser is higher than the frequency of the module clock CLK (see FIGS. 3 and 5), then the inputs A and E of the chronometer ZM must be interchanged (CLK at input A, SDA at input E). As a result of the drive of the gate circuit SH by the signal SDA and of the high pulse repetition rate of the laser LA, however, a much greater number of measured values g(t) will then be read into the memory unit MEM without a corresponding output signal of the chronometer ZM being present at the data input 2. Since the chronological ordering of the measured values g(t) is only possible with the use of the measured time values $\Delta t$, value pairs which do not have a $\Delta t$ portion cannot be taken into consideration in the evaluation. Only a small part of the data deposited in the memory unit MEM is therefore interpretable. It is therefore advantageous to only store the value of the measured signal g(t) when a trigger signal CLK is also present. This is achieved in accordance with the present invention in that the arrangement according to FIG. 1 is expanded by a circuit portion composed of an AND gate AND connected at its output side to the control input of the gate circuit SH and of a monoflop MF1 receiving on its input the trigger signal CLK (see FIG. 4). The time constant of the monoflop MF1 is thereby selected such that it is lower than the chronological spacing of successive laser pulses. Thus the time constant assures that only laser pulses (represented by the isochronically occurring signal SDA at the input of the gate AND) that chronologically immediately follow the trigger signal CLK activate the gate circuit SH.

In order to reduce the specimen load with the laser beam LA, the measurement can be limited to a variable time window at whose beginning the trigger signal CLK appears. The trigger signal CLK that can be taken at the output C of the controller CON is therefore also supplied to the input of an adjustable monoflop MF2 whose output signal drives a switch element PZ, for example a Pockels cell, that is arranged in the beam path of the scanning laser microscope. The switch element PZ is not necessary when the laser Q itself can be switched (Q-switching). In this case, the output of the monoflop MF2 is directly connected to the corresponding control input of the laser Q.

The present invention, of course, is not limited to the exemplary embodiments that have been set forth. Instead of using the module clock, every signal synchronous with the event to be recorded can be used as trigger signal CLK, thus, for example, some other internal signal of the integrated circuit IC. The method of the present invention is therefore particularly suited for the examination of integrated components having asynchronously operating circuit sections wherein the trigger signal CLK cannot be taken at the controller CON.

Instead of the photo-electrons PE, of course, the induced specimen current (optical beam induced current) can also be measured and recorded. The laser beam LA thereby generates electron-hole pairs in the integrated circuit IC that are separated in the proximity of pnjunctions and thereby induce a current that can be recorded at the external terminals of the circuit.

Figure 4:
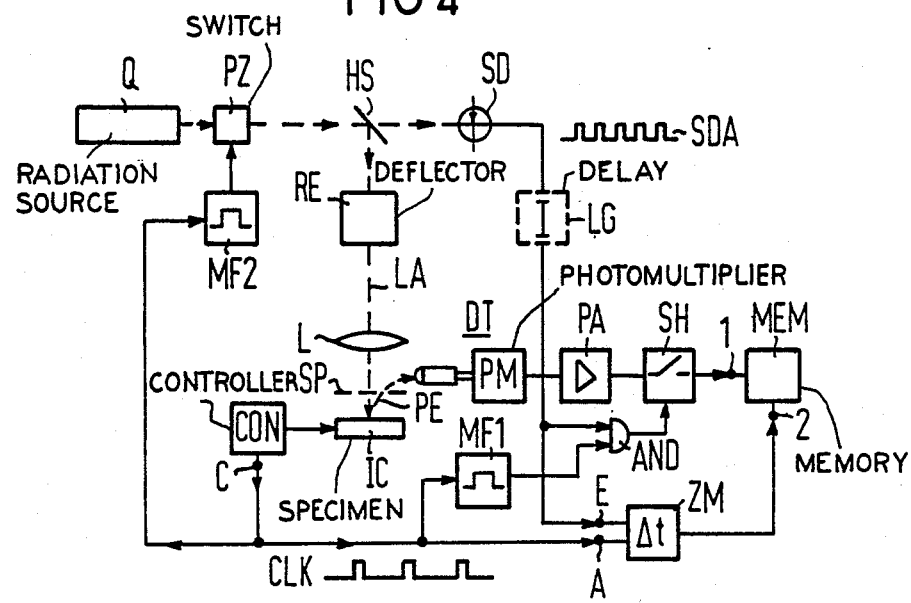
FIG. 4 is a block diagram of another arrangement for implementing the method of the present invention.
Figure 5:
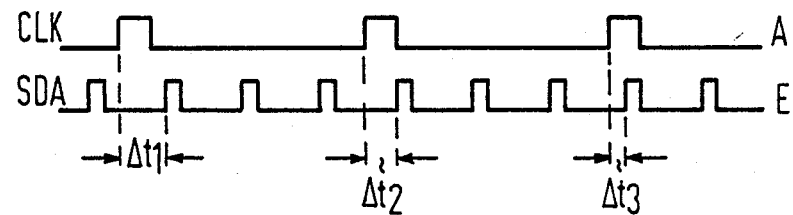
FIG. 5 signals in the FIG. 4 arrangement for a time measurement.

When electro-optical effects are to be utilized for recording high-frequency signals, then the structure of the measuring electronics set forth with reference to FIGS. 1 and 4 remains unaltered. Instead of the photoelectrons, however, the rotation of the polarization plane of the laser beam must then be detected in an electro-optical medium. The scanning laser microscope in this case, for example, is equipped with a second semi-transmissive mirror that gates the laser emission reflected at the underside of an electro-optical crystal arranged on the circuit out of the beam path and supplies it to a polarizer detector unit. The fundamental structure of an apparatus suitable for these measurements is known to a person skilled in the art from, for example, IEEE journal of Quantum Electronics, Vol. 22, No. 1 pages 69–78 (in particular, see FIG. 2).

The measure g(t) and Δt can also be recorded topically resolved by the laser beam LA being swept across the specimen IC in line-like fashion. The position of the laser beam LA on the specimen surface that is defined by the output signal of the scan generator driving the deflector unit RE is also stored in addition to the value pair (g(t), Δt).

The computer or a fast mass memory, for example, can be used as the memory unit MEM.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for recording periodic signals with a laser probe, whereby the laser probe is pulsed and is directed onto at least one point of a specimen carrying a first signal, and whereby a secondary signal triggered on the specimen by the laser probe is detected and is converted into a measured signal (g(t)), comprising asynchronously gating the laser probe; identifying chronological spacing (Δt) of the pulses of the laser probe relative to a second signal (CLK) synchronous with said first signal; and recording the value of the measured signal (g(t)) associated with the respective pulse of the laser probe and the measured chronological spacing (Δt) of the pulse relative to the second signal (CLK).

2. The method according to claim 1, wherein the measured signal (g(t)) is derived from a secondary particle signal measured in a detector.

3. The method according to claim 1, wherein the measured signal (g(t)) is derived from an induced specimen current.

4. The method according to claim 1, wherein a rotation of the polarization plane of the laser probe generated in an electro-optical medium is measured and the measured signal (g(t)) is derived therefrom.

5. The method according to claim 1 wherein the laser probe is swept across the specimen surface, and wherein the value pairs composed of the measured time difference (Δt) and of the associated value of the measured signal (g(t)) are recorded as a function of the location of the laser probe on the specimen.

6. A arrangement for recording periodic signals with a laser probe, having a means for generating a pulsed laser probe, having a lens system for focusing the laser probe onto a specimen, having a means for positioning the laser probe to at least one point of the specimen that carries a first signal, having a means for detecting a secondary signal (PE) generated on or within the specimen by the laser probe, having an evaluation electronics connected to a means for generating a measured signal (g(t)), said means for generating having an input connected to an output of said means for detecting, and having a recording unit having at least a first input connected to an output of said means for generating, comprising a means for measuring a time difference (Δt) that has an output connected to a second input of the recording unit, a first input of said means for measuring receiving a second signal (CLK) synchronous with said first signal and a radiation detector whose output signal (SDA) is received by a second input of the means for measuring the time difference (Δt), the radiation detector receiving on an input thereof the pulsed laser probe.

7. The arrangement according to claim 6, wherein the evaluation electronics includes a gate circuit.

8. The arrangement according to claim 7, wherein a sample and hold circuit is the gate circuit.

9. The arrangement according to claim 7, wherein a control input of the gate circuit is the output signal (SDA) of the radiation detector.

10. The arrangement according to claim 7 wherein the arrangement further comprises an AND gate having an output connected to a control input of the gate circuit and a monostable circuit having its input receiving the second signal (CLK), whereby a first input of the AND gate receives the output signal (SDA) of the radiation detector and a second input receives the output of the monostable circuit.

11. The arrangement according to claim 6, wherein the arrangement further comprises a second monostable circuit having an output connected to a means for the modulation of the intensity of the laser probe, the second signal (CLK) being received by an input of the second monostable circuit.

* * * * *